(12) United States Patent
Kuyel

(10) Patent No.: US 12,197,125 B2
(45) Date of Patent: Jan. 14, 2025

(54) MASK AND RETICLE PROTECTION WITH ATOMIC LAYER DEPOSITION (ALD)

(71) Applicant: Nano-Master, Inc., Austin, TX (US)

(72) Inventor: Birol Kuyel, Austin, TX (US)

(73) Assignee: Nano-Master, Inc., Austin, TX (US)

( * ) Notice: Subject to any disclaimer, the term of this patent is extended or adjusted under 35 U.S.C. 154(b) by 345 days.

(21) Appl. No.: 17/130,503

(22) Filed: Dec. 22, 2020

(65) Prior Publication Data

US 2022/0197131 A1    Jun. 23, 2022

(51) Int. Cl.
| | |
|---|---|
| *H01L 21/31* | (2006.01) |
| *G03F 1/24* | (2012.01) |
| *G03F 1/26* | (2012.01) |
| *G03F 1/48* | (2012.01) |
| *G03F 1/62* | (2012.01) |
| *G03F 7/00* | (2006.01) |
| *H01L 21/033* | (2006.01) |

(52) U.S. Cl.
CPC .............. *G03F 1/48* (2013.01); *G03F 1/24* (2013.01); *G03F 1/26* (2013.01); *G03F 1/62* (2013.01); *G03F 7/70983* (2013.01); *H01L 21/0332* (2013.01); *H01L 21/0337* (2013.01)

(58) Field of Classification Search
CPC .................. H01L 21/02107; H01L 21/31
See application file for complete search history.

(56) References Cited

U.S. PATENT DOCUMENTS

| | | |
|---|---|---|
| 3,906,133 A | 9/1975 | Flutie |
| 4,282,267 A | 8/1981 | Kuyel |
| 4,537,813 A * | 8/1985 | Kuyel ................. G03F 1/62 428/209 |
| 5,332,442 A | 7/1994 | Kubodera et al. |
| 6,190,743 B1 | 2/2001 | Wang |
| 6,576,053 B1 * | 6/2003 | Kim ............. H01L 21/02181 257/E21.271 |

(Continued)

OTHER PUBLICATIONS

Beneq, "Advanced tool for advanced ALD research: Thin Film System—TFS 200", Beneq, Jul. 1, 2009, 28 pgs.

(Continued)

*Primary Examiner* — Thomas T Pham
(74) *Attorney, Agent, or Firm* — Asif Ghias

(57) ABSTRACT

Techniques are disclosed for protecting a lithographic mask and its lithographic pattern during the lifecycle of the mask. This is accomplished by deposited an extremely uniform and geometrically conformal protective coating on the mask that provides it mechanical and electrostatic protection. The coating envelopes or surrounds the pattern on the mask thereby providing it protection during the various operations in the lifecycle of the mask, including cleanings, repairs, inspections, etc. The conformal coating is deposited using atomic layer deposition (ALD) which is preferably a plasma-enhanced ALD (PEALD) or preferably still a continuous-flow PEALD. The instant conformal coating protects various types of lithographic masks including projection or contact photomasks or extreme ultra-violet (EUV) masks. While improving the yield, the conformal coating, that may eventually be sacrificial, protects the underlying mask and its lithographic pattern from mechanical or other forms of damage.

8 Claims, 8 Drawing Sheets

(56) References Cited

U.S. PATENT DOCUMENTS

| | | | |
|---|---|---|---|
| 6,841,309 B1* | 1/2005 | Alpay | G03F 1/48 |
| | | | 430/5 |
| 6,863,021 B2 | 5/2005 | Sneh | |
| 6,916,398 B2 | 7/2005 | Chen et al. | |
| 6,998,014 B2 | 2/2006 | Chen et al. | |
| 7,138,336 B2 | 11/2006 | Lee et al. | |
| 7,314,667 B2 | 1/2008 | Tregub et al. | |
| 7,314,835 B2 | 1/2008 | Ishizaka et al. | |
| 7,341,959 B2 | 3/2008 | Brcka | |
| 7,780,785 B2 | 8/2010 | Chen et al. | |
| 7,966,969 B2 | 6/2011 | Hasper et al. | |
| 8,187,679 B2 | 5/2012 | Dickey et al. | |
| 8,192,903 B2 | 6/2012 | Wang | |
| 8,637,411 B2 | 1/2014 | Swaminathan et al. | |
| 8,728,955 B2 | 5/2014 | LaVoie et al. | |
| 8,940,646 B1 | 1/2015 | Chandrasekharan et al. | |
| 9,343,296 B2 | 5/2016 | LaVoie | |
| 9,972,501 B1 | 5/2018 | Kuyel | |
| 10,361,088 B2 | 7/2019 | Kuyel | |
| 10,366,898 B2 | 7/2019 | Kuyel | |
| 2002/0129769 A1 | 9/2002 | Kim et al. | |
| 2007/0080387 A1 | 4/2007 | Liu et al. | |
| 2008/0110400 A1 | 5/2008 | Satou et al. | |
| 2008/0185571 A1* | 8/2008 | Happ | H10B 63/20 |
| | | | 257/E47.001 |
| 2009/0075179 A1 | 3/2009 | Ultanir et al. | |
| 2011/0003087 A1 | 1/2011 | Soininen et al. | |
| 2012/0141676 A1 | 6/2012 | Sershen et al. | |
| 2012/0269968 A1 | 10/2012 | Rayner | |
| 2013/0236818 A1* | 9/2013 | Lee | G03F 1/24 |
| | | | 430/5 |
| 2013/0251916 A1 | 9/2013 | Krueger et al. | |
| 2014/0216337 A1 | 8/2014 | Swaminathan et al. | |
| 2014/0366804 A1 | 12/2014 | Pak et al. | |
| 2015/0104736 A1 | 4/2015 | Hsu et al. | |
| 2015/0167167 A1 | 6/2015 | Vermeer et al. | |
| 2015/0369781 A1* | 12/2015 | Zheng | G01N 30/32 |
| | | | 422/503 |
| 2015/0376785 A1 | 12/2015 | Knaapen et al. | |
| 2016/0052655 A1 | 2/2016 | Nguyen et al. | |
| 2016/0079056 A1 | 3/2016 | Harada et al. | |
| 2016/0141299 A1* | 5/2016 | Hong | H10B 43/35 |
| | | | 438/157 |
| 2016/0312360 A1 | 10/2016 | Rasheed et al. | |
| 2016/0342079 A1 | 11/2016 | Oh et al. | |
| 2017/0002463 A1 | 1/2017 | Fan et al. | |
| 2017/0016114 A1 | 1/2017 | Becker et al. | |
| 2019/0035605 A1* | 1/2019 | Suzuki | H01L 21/0337 |
| 2019/0384163 A1 | 12/2019 | Kim et al. | |
| 2020/0150527 A1 | 5/2020 | Chen et al. | |
| 2020/0161132 A1 | 5/2020 | Chen et al. | |
| 2021/0135106 A1* | 5/2021 | Ku | H01L 21/76802 |

OTHER PUBLICATIONS

Hossbach, C. et al., "Overview of ALD equipment and technologies", ALD for Industry 2017, EFDS Workshop, Institute of Semiconductors and Microsystems—Technical University of Dresden, Jan. 17, 2017, 47 pgs.

Kaariainen, Tommi O. et al., "Plasma-Assited Atomic Layer Deposition of Al2O3 at Room Temperature", Plasma Processess and Polymers, Wiley Inter-Science, Jun. 2009, pp. 237-241.

Standing, A.J., "Nanowire solar water splitting", Technische Universiteit Eindhoven, Thesis—Applied Physics, Jan. 6, 2016, 170 pgs.

* cited by examiner

MASK AND RETICLE PROTECTION WITH ATOMIC LAYER DEPOSITION (ALD)

FIELD OF THE INVENTION

This invention relates generally to lithography and more specifically for protecting lithography/lithographic masks/reticles with their lithography/lithographic patterns used in printing of integrated circuits.

BACKGROUND ART

Patterned lithographic masks or lithography masks are used in lithography for printing electronic circuits on silicon wafers. There are many different types of masks used in the industry. Photomasks are used for 1:1 contact printing or proximity printing. Alternately, they are used for 5:1 or 4:1 projection printing. From the perspective of principles of operation, a lithographic photomask may be a binary photomask or a phase-shift photomask (PSM) for higher resolutions. The mask may also be an extreme ultraviolet (EUV) mask.

A lithography mask has a high-resolution pattern that absorbs electromagnetic radiation incident on the mask. For a photomask, the pattern is deposited on a glass substrate and absorbs optical light. For an EUV mask, the pattern is deposited on a reflective multilayer (ML), typically of silicon (Si) and Molybdenum (Mo). The feature sizes of the pattern are ever-shrinking.

The quality of the pattern is very critical to the semiconductor manufacturing process, and the lithography masks must therefore be produced free from any defects. Maintaining the masks in this defect-free state is essential if high device yields are to be maintained. In addition to particulate contamination, the various cleaning, inspection and handling operations that the mask must undergo can cause a slow deterioration of the pattern.

Additionally, the pattern, typically made out of metal, is an electrical conductor, whereas the underlying substrate is an insulator. As a result of various processes, such as by electrostatics or ultraviolet (UV) illumination-emission of photoelectrons, islands of metallic pattern can undesirably be charged to different electrical potentials. If a potential difference of a few volts occurs over a short distance of a micron, an electrical discharge can occur. This discharge ablates material from the metallic pattern causing its erosion and/or formation of pinholes in it and causing particles to land on the mask thereby producing defects. When such defects are multiplied by the numerous masks required to fabricate a given semiconductor device, the yield loss can become significant. If the same mask prints hundreds of chips on the same wafer, then all the chips may be dead, and if the same mask is used for all the wafers then one killer defect can bring total good chip yield to zero.

One approach to protecting a metallic photomask pattern as described in U.S. Pat. No. 3,906,133 to Flutie is to deposit a simple protective coating thereon. That patent describes an iron oxide masking layer on a transparent substrate which has a protective nitrocellulose coating thereon. The coating has a thickness greater than the height of protrusions on the surface. However, these techniques are directed only towards contact printing wherein the photomask is placed in intimate contact with the photoresist coated wafer.

But, in projection printing, the photomask is spaced from the resist coated wafer and the light passing through the photomask must be focused onto the resist coating by an optical system. It has been observed that such protective coatings do not have uniform thickness and cause reflection of the light due to the difference between the refractive indices of the substrate and the coating material, resulting in poor pattern definition. Additionally, nitrocellulose film coating has other disadvantages. Being made of plastic, it can be easily scratched and being a good dielectric, its surface can readily charge.

If the mask/reticle is un-pelliclized, the substantial charge on a typical underlying quartz substrate attracts particles that rain upon the mask. Furthermore, the surface charge also electrostatically attracts particles raising the number of defects. Even though "clean rooms" used for very large-scale integration (VLSI) minimize the number of such defect causing particles, the masks may still need be cleaned to remove those particles, resulting in a loss of throughput. As feature sizes shrink, smaller and smaller particles not only can be accumulated much faster with charged surfaces, but they are also much more difficult to remove with known cleaning techniques. The combination of more frequent cleaning, susceptibility of surface scratches during cleaning, and accumulation of unremovable defects results in frequent removal and reapplication of such film, causing further defects in the mask pattern.

For addressing the needs of an inexpensive design for protecting the metallized surface of a mask while maintaining high definition and low defect densities, an alternative technique was proposed in U.S. Pat. No. 4,537,813 to Birol Kuyel. This patent is incorporated by reference herein for all purposes in its entirety. In this patent, plasma deposited silicon dioxide (SiO2) is used as a protective layer over metallic patterns in order to prevent electrostatic damage and wear during cleaning. Deposited film has substantially matching index to that of underlying substrate, such as glass.

The above results in good step coverage around the metallic pattern and further bulk conductivity to eliminate charging non-uniformity or voltage differential between islands of the metal. In addition, a surprising additional benefit is observed: the printed patterns have higher resolution because thickness of the coating at the edge of Cr patterns acts as a phase-shift enhancement. However, a drawback of the above design is that small crystalline particles in the SiO2 film cannot be fully eliminated. Their diffraction patterns are thus printed as defects. As feature sizes of today's design rules shrink, the step coverage of the deposited SiO2 film is not satisfactory, even when deposition is performed using plasma enhanced chemical vapor deposition (PECVD).

Atomic layer deposition (ALD) is a type of vacuum deposition technique. ALD utilizes a sequential exposure of gaseous reactants for the deposition of atomically sized thin films. The reactants are often metal precursors consisting of organometallic liquids or solids used in the chemistry by vaporizing under vacuum and/or heat conditions. The reactants are introduced as a series of sequential, non-overlapping pulses. In each of these pulses, the reactant molecules react with a substrate or wafer surface in a nucleation-based and self-limiting way.

Consequently, the reaction ceases once all the sites on the wafer/substrate surface are consumed. Between the pulses, a purge step is applied to remove the excess reactants and byproducts from the process chamber. Using ALD, it is possible to grow materials uniformly and with high-precision on arbitrarily complex and large substrates. Some examples of films produced using ALD are SiO2, Si3N4, Ga2O3, GaN, Al2O3, AlN, etc.

There is prior art utilizing ALD for forming a protective coating in photomasks. U.S. Patent Publication No. 2016/

0342079 A1 to Oh et al. discloses a photomask that includes a transparent substrate, a mask pattern formed on the substrate, and a coating covering sidewalls of the mask pattern. The coating may be formed using ALD. The objective of their design is to make a phase-shirt photomask (PSM) and not to protect the underlying mask pattern. Therefore, as a shortcoming of their technology, the coating on top of the masked pattern is removed in order to make the PSM. Their design cannot protect the lithographic pattern.

It is therefore desirable to protect a lithography/lithographic mask or reticle and its lithography/lithographic pattern by a protective coating. It is also desirable for the coating to be nucleation-based and conformal to the mask/reticle and be extremely uniform over the entire mask/reticle. The mask/reticle may be a photomask/photo-reticle or an EUV mask/reticle. Such a design would achieve the advantages of electrostatic charge uniformity over the pattern while at the same time eliminating small crystalline particles that are otherwise inevitably attracted to it in the techniques of the prior art.

OBJECTS OF THE INVENTION

In view of the shortcomings of the prior art, it is an object of the present technology to provide methods and apparatus/systems for depositing a protective conformal coating or film using ALD over a lithographic pattern of a lithography mask/reticle. The lithographic pattern absorbs electromagnetic radiation incident on the mask/reticle.

It is also an object of the present technology to deposit such a protective conformal coating on a mask that may be a photomask or an extreme ultraviolet (EUV) mask.

It is another object of the instant design to produce such a protective conformal coating one atomic layer at a time using ALD. The ALD may be plasma-enhanced ALD (PEALD).

It is another object of the present design to deposit the conformal coating using continuous-flow PEALD.

It is another object of the current invention to form such a protective conformal coating by nucleation-based reactions.

It is still another object of the invention to deposit such a protective coating over a reticle that is pelliclized afterwards.

It is another object of the present technology to achieve excellent step coverage of its protective conformal coating deposited over the lithographic pattern.

While performing continuous-flow PEALD, it is an object of the invention to produce a high quality/uniformity conformal coating/film with fast cycle-times and low cost of operation.

Still other objects and advantages of the invention will become apparent upon reading the detailed description in conjunction with the drawing figures.

SUMMARY

The objects and advantages of the present technology are secured by methods and apparatus or systems for depositing a conformal coating or film on a lithographic mask or a reticle. The conformal coating is meant to protect the electromagnetic radiation absorbing pattern on the mask that is used for printing integrated circuits on wafers. The objective of the coating is to protect the pattern while the protected lithographic mask undergoes various lithographic operations during its lifecycle including cleanings, repairs, inspections, etc.

The protective coating is deposited using the techniques of atomic layer deposition (ALD). The coating thus deposited is therefore produced by nucleation-based chemical processes, as opposed to chemical vapor deposition (CVD) based processes of the prior art. The coating is deposited conformally on all sides or sidewalls as well as on the top/tops or distal end/ends of the pattern on the lithographic mask.

The conformal coating thus deposited is retained on all sides as well as the top(s) of the pattern to render it protection during the lifecycle of the mask. In contrast to the present technology, the techniques of the prior art remove the conformal coating from the top(s) in order to produce phase-shift masks. Since the present design is aimed at protecting the pattern on the substrate completely, the conformal ALD coating is retained around all edges/peripheries of the pattern, as opposed to just the sides as in prevailing technologies.

In various embodiments, the lithographic mask protected by instant conformal coating may be a binary photomask, a phase-shift photomask (PSM), a projection photomask, a contact photomask, a proximity photomask, an extreme ultraviolet (EUV) mask or the like. In related variations, the instant conformal coating may be used to protect a reticle of any of the above masks rather than the entire mask. In still other variations, the reticle may be housed in or protected by a pellicle after the depositing of the instant conformal coating.

In a preferred embodiment, the conformal coating is composed of an oxide. Preferably, the oxide coating is actually silicon dioxide (SiO2) that acts as a "leaky dielectric". Preferably still, the conformal protective coating is composed of more than one type of materials or chemical species, such as a combination of more than one oxides.

In another embodiment, the substrate underlying the metallic pattern of the mask is a glass substrate. The glass substrate may actually be composed of fused silica or quartz or a soda-lime or the like. The present techniques allow for the conformal coating to take place at much less extreme temperatures than the techniques of the prior art. More specifically, the instant coating can take place at a substantially room temperature, or at least in the range of 20-60° C.

In other embodiments, the refractive indices of the conformal coating and substrate materials are kept substantially similar. More specifically, the difference in indices is kept less than or equal to 1/100. This allows for avoidance of reflection and interference patterns at the coating/substrate interface resulting in less optical defects and ultimately greater yield.

In embodiments where the lithographic mask being protected by the instant conformal coating is an EUV mask, the refractive index of the coating may be matched to the index of the capping layer or the index of the topmost layer of the multilayer (ML) of the EUV mask. This allows for ease of optical inspections of the EUV mask under optical wavelengths.

In a set of highly preferred embodiments, the ALD process employed for depositing the instant conformal coating is a plasma-enhanced ALD (PEALD) or a plasma-activated ALD (PALD). The nucleation-based processes occurring in such a PEALD/PALD-based design allow for the instant conformal coating to deposit one atomic layer at a time, and henceforth with extremely uniform thickness. In a set of related highly preferred embodiments, the PEALD/PAALD used is a continuous-flow PEALD/PEALD.

The instant coating resulting in the above-described embodiments have a number key benefits or advantages over the prior art. These include having an extremely uniform electrostatic potential across the coating by appropriate doping of the coating/film. Henceforth, this avoids forming of islands of electrostatic potential that may otherwise result in arcing and consequent damaging of the pattern, as in the techniques of the prior art. Thus, instant protective conformal coating protects the underlying pattern not only from mechanical damage but also electrostatic/static arcing. Differently put, instant protective conformal coating provides mechanical as well as electrostatic protection to the lithographic pattern.

Other advantages include uniform stoichiometric composition, excellent step coverage and a very uniform refractive index. The benefits also include no optical defects due to crystalline particles as in the prior art, because the chemical process generating the coating is nucleation-based per above. The benefits of the instant design further include the ability to grow a gradient based coating such as using different chemical species for matching various materials underneath. Furthermore, since the coating is ultra-smooth, there is reduced scattering of incident electromagnetic radiation.

Clearly, the system and methods of the invention find many advantageous embodiments. The details of the invention, including its preferred embodiments, are presented in the below detailed description with reference to the appended drawing figures.

BRIEF DESCRIPTION OF THE DRAWING FIGURES

DETAILED DESCRIPTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
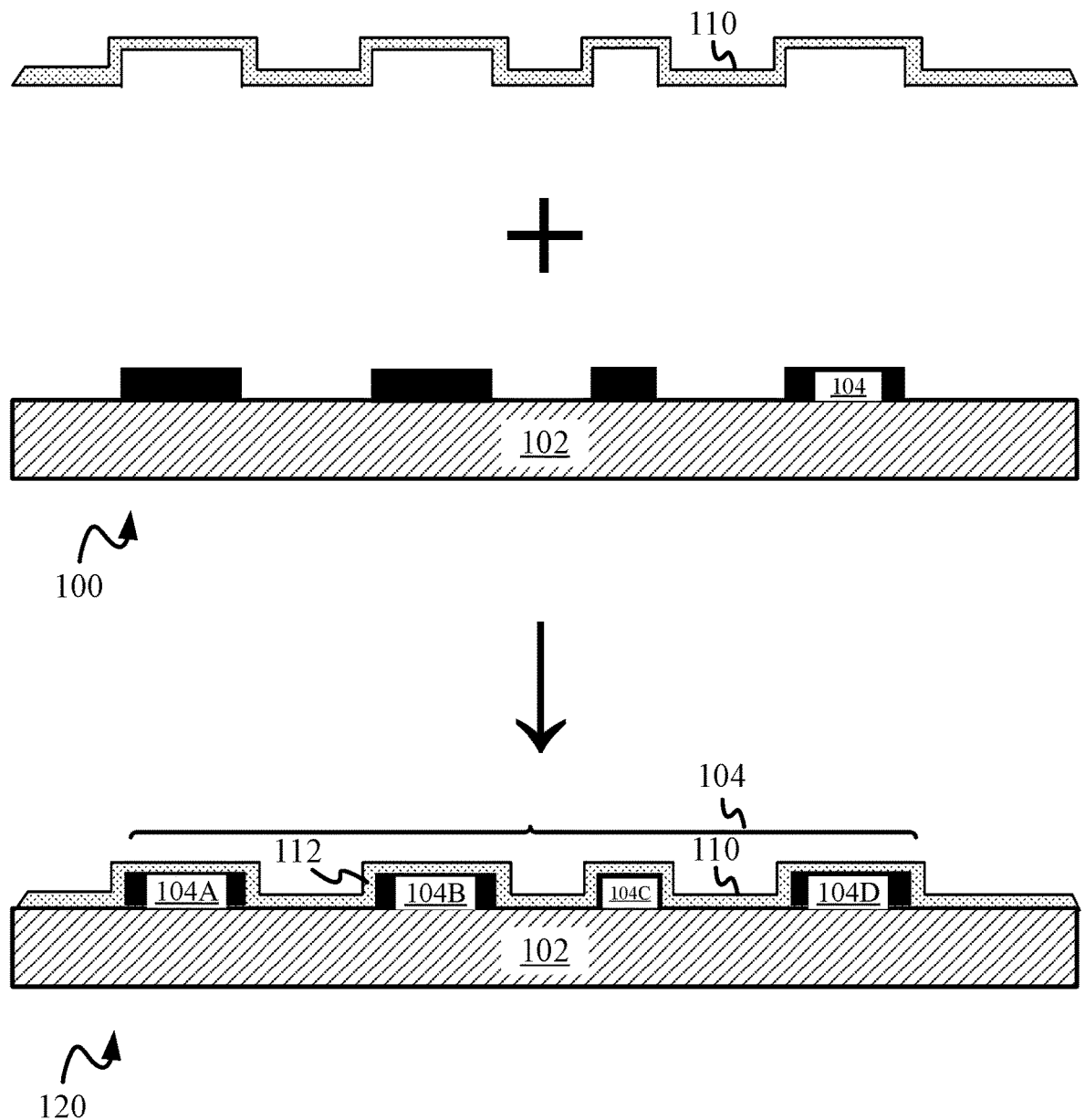
FIG. 1 illustrates a cross-sectional view of a lithography mask on which an instant protective conformal coating/film is deposited.

The present technology will be best understood by first reviewing a lithography mask on which an instant conformal protective coating is deposited as shown in FIG. 1. In the embodiment of FIG. 1, a cross-sectional view of a typical lithography mask 100 is shown with a substrate 102 on which a pattern 104 has been deposited or grown. As appreciated by those skilled in the art, when electromagnetic radiation (not explicitly shown in FIG. 1) is incident upon mask 100 from above, pattern 104 absorbs this radiation. The radiation that is not absorbed by pattern 104 is allowed to go through transparent substrate 102 if mask 100 is a photomask, and reflected back if mask 100 is an extreme ultraviolet (EUV) mask, and then onto a silicon wafer that is consequently etched with the desired integrated circuit.

FIG. 1 further shows an instant conformal coating 110 based on the instant principles. Coating 110 is deposited conformally on pattern 104 of mask 100, thereby resulting in a protected lithography mask 120 as shown. Protected lithography mask 120 has many desirable properties as compared to the traditional lithography mask 100 as will be taught herein. Note that protected lithography mask 120 in the lower portion of FIG. 1 explicitly identifies four distinct features 104A, 104B, 104C and 104D of pattern 104 shown by the bracket. Conformal coating protects features 104A-D of pattern 104 during the lifecycle of protected mask 120. Of course, conformal coating 110 also protects the areas of substrate 102 exposed or not covered by pattern 104. These are the portions of substrate 102 shown in FIG. 1 where features 104A-D do not exist.

Features 104A-D may be of the same height although that is not a requirement for protective conformal coating of the present design to protect pattern 104 and accrue its benefits. Explained further, the tops or the distal ends of features 104A-D may not be in the same plane, and further the features may not even be connected to one another, and/or may not have top surfaces that are even. The present technology admits of any number, sizes and shapes of such features 104A, 104B, . . . , connected or isolated, of electromagnetic radiation absorbing pattern 104 of protected lithography mask 120. Therefore, pattern 104 may have many tops or distal ends and of course many sidewalls or simply sides.

By a conformal coating we mean that the coating is deposited on the pattern features regardless of their number and sizes and while conforming to their exterior shapes, regardless of the form of the shapes. In other words, it completely surrounds or envelopes all features of the pattern in a geometrically conformal manner. Of course, there is one side of the features that is attached to the underlying mask/substrate on which the coating is not deposited.

With the above in mind, in order to avoid unnecessary repetition and to avoid detraction from the key principles, the teachings and drawing figures of this disclosure may reference lithographic patterns, such as pattern 104 of FIG.

1, only in the singular. In other words, a lithography pattern or lithographic pattern may be referenced with a single top or distal end with the implicit knowledge that it actually likely has many individual tops or apexes or summits corresponding to its individual features. Of course, a lithography pattern will always be considered as having more than one or multiple sides or sidewalls because even a single feature, such as feature 104A of pattern 104 will have more than one sides/sidewalls.

Conformal protective coating or protective conformal coating or simply conformal coating 110 of FIG. 1 is exemplarily made of an oxide such as silicon dioxide (SiO2). But the present technology admits of any suitable material for coating 110. Conformal coating 110 provides a mechanical barrier over underlying pattern 104 and protects it from mechanical damage during use/operation, inspections and cleaning operation(s) of mask 120. Pattern 104 may be composed of a suitable metal such as chromium (Cr) with an overlying chromium oxide layer, or pattern 104 may be composed of any other suitable material, such as tantalum (Ta), tungsten (W), etc. Underlying substrate may be a glass substrate composed of fused silica, quartz, soda-lime, etc.

It is critical that such a protective coating not introduce image distortions and degradation. In the techniques of the prior art, such as U.S. Pat. No. 4,537,813 to Birol Kuyel referenced above in the Background section and incorporated by reference herein, it was shown that actually such a coating may improve local image resolution in photolithography. However, since the protective coating was deposited via chemical deposition vapor (CVD) or plasma enhanced CVD (PECVD), it was inherently prone to physical and chemical imperfections. The present technology overcomes these shortcomings of the prior art by growing protective coating 110 of FIG. 1 conformally using ALD/PEALD one atomic layer at a time.

Before proceeding further, it will be appreciated by the skilled reader that lithography is a process for microfabricating a wafer. Photolithography uses light to transfer a geometric pattern via optical refraction from a photomask (also referred to as an optical mask) to a light-sensitive or photosensitive chemical photoresist layer on the wafer. On the other hand, in extreme ultraviolet (EUV) lithography, an EUV mask is used for transferring the mask pattern onto the wafer via reflection.

Furthermore, in projection photolithography, the photomask does not stay in direct contact with the wafer, or in other words, the photomask stays above the wafer. Such a photolithography typically employs demagnification of the pattern in a 1:4 or 1:5 ratio while transferring it onto the wafer. On the other hand, in contact lithography, also known as contact printing, pattern image is printed onto the wafer via shadow-graphy in a 1:1 ratio by illumination of a contact photomask in direct contact with the photoresist on the wafer.

In order to overcome some of the limitations of contact photolithography, in a related technique known as proximity photolithography, the mask is kept ever so slightly above the wafer. As a consequence of the differences in their operating principles, projection photolithography can only capture a limited spatial frequency spectrum from photomask, whereas contact printing has no such resolution limit. However, it is more sensitive to the presence of defects on the photomask or on the wafer.

While a projection photomask may contain the entire projection pattern for a single layer of a full wafer, a typical setup involving a projection photomask or an EUV mask uses a reticle that has a pattern to print a subset of a single layer of the wafer. Therefore, in order to expose the entire wafer a reticle has to be stepped and repeated. Stated differently, a mask may contain a pattern that can be printed in a single exposure to cover the entire wafer in a 1:1 manner, whereas a reticle only refers to a subset of the mask pattern for a single layer of the wafer. Most typically, an EUV setup uses a reticle exposing only a section of the wafer. A set of steps are then typically required to expose the entire wafer in what is referred to as a step-and-scan technology. Unless otherwise explicitly distinguished, the benefits of the present technology discussed in this disclosure apply to both a lithography/lithographic mask or a (lithography/lithographic) reticle.

Furthermore, a photomask may be a binary photomask in which a photomask blank is covered with patterned layer of opaque material. Its transmission properties are binary, i.e. either transparent ("1") or opaque ("0"). A photomask may also be a phase-shift mask/photomask (PSM) in which higher resolution and increased DOF (Depth of Focus) is achieved by controlling the phase shift and the transmission rate of the electromagnetic radiation.

The advantageous aspects of the present technology apply to all different types of lithographic techniques and their respective masks/reticles, some examples of which are discusses above. More specifically, in a preferred set of embodiments, an instant conformal coating, such as coating 110 of FIG. 1 may be deposited, on a photomask that may be a binary photomask, a phase-shift photomask, a projection photomask, a contact photomask, a proximity photomask, or the like. In other embodiments, such a coating may be deposited on an EUV mask, in which case underlying substrate 102 would contain a multilayer (ML) as discussed further below. Alternatively, or in addition, it may be deposited on a reticle of a projection photomask or an EUV mask. Still in related embodiments, such a reticle may be housed or protected under a pellicle, as will be discussed further below.

Armed with the above knowledge, let us proceed further with FIG. 1 and the embodiments covered therein. Instant conformal coating 110 is deposited using an atomic layer deposition (ALD) process instead of the traditional chemical vapor deposition (CVD) processes of the prior art. As a result, coating 110 has an extremely uniform thickness across a large surface area of protected lithography mask 120. This is because as opposed to flow-dependent vapor deposition processes of traditional CVD, chemical processes involved in ALD are nucleation-based and self-limiting, resulting in depositing of coating 110 one atomic layer at a time.

Figure 2:
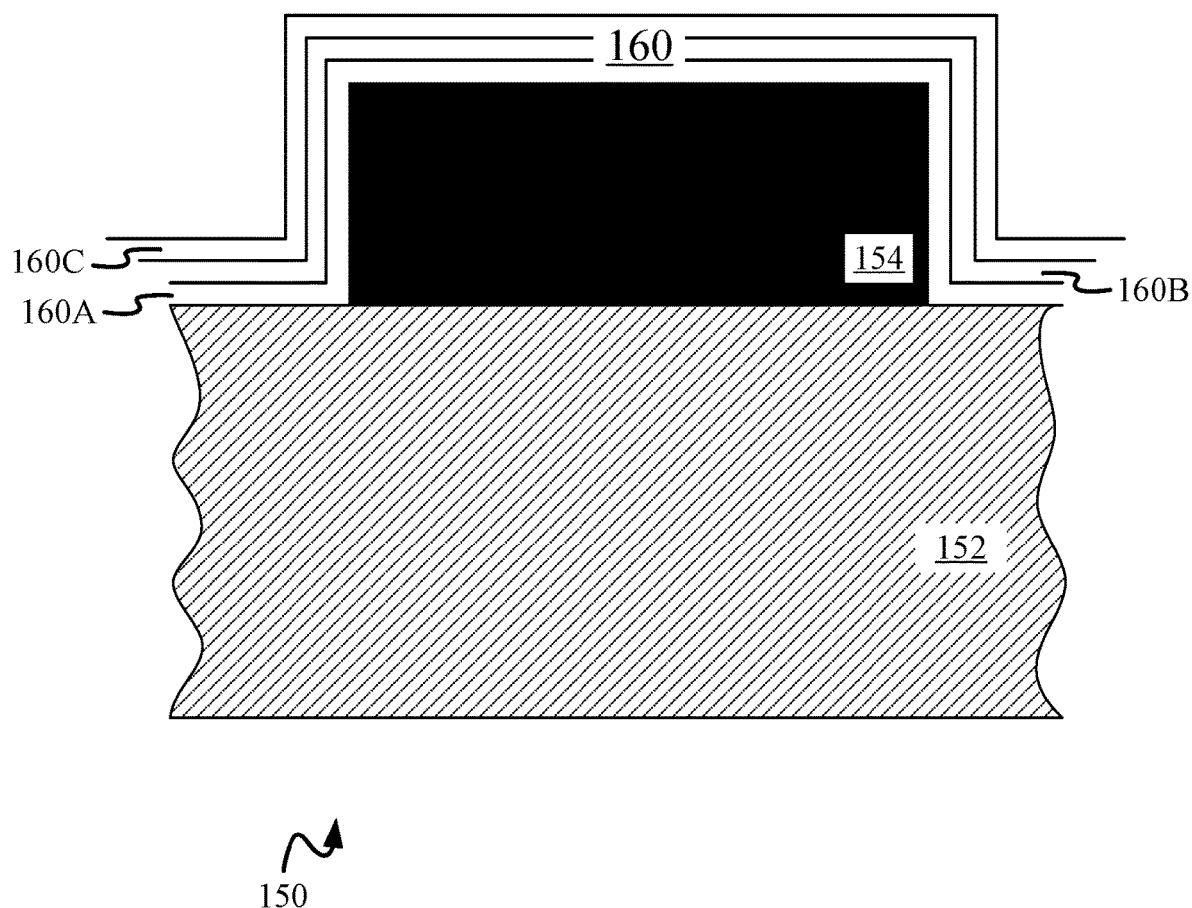
FIG. 2 shows a cross-sectional view of a portion of a protected instant lithography mask, explicitly showing individual atomic layers of an instant conformal coating.

This is explicitly shown in FIG. 2 showing a cross-sectional view of a portion of a protected instant lithography mask 150. In the portion of mask 150 shown, an instant conformal coating 160 composed of individual atomic layers 160A, 160B and 160C is shown deposited on a pattern feature 154 over a substrate 152. The advantageous aspects of instant ALD based deposition of protective conformal coating 110 and 160 of photomasks 120 and 150 of FIG. 1 and FIG. 2 respectively are numerous. These include:

1. Protection from, or elimination/reduction of electrostatic arcing: Without a protective coating as in the techniques of the prior art, electrostatic charge differential between islands of pattern 104/154 of FIG. 1/FIG. 2 could cause potential difference in the air to exceed breakdown threshold. This would cause electrostatic arcing between those islands, resulting in damaging of the metallic pattern. This is also the case with the prior art of U.S. Patent Publication No. 2016/

0342079 A1 to Oh referenced in the Background section. In this prior art technique, their protective layer is removed from the top or distal end of metallic pattern for producing their phase-shift mask, resulting in islands of electrostatic potential difference and consequent damaging arcing between those islands of the pattern.

In contrast, a key benefit of the present technology is that with appropriate/controlled doping of its instant conformal coating, the conductivity and resistivity of the coating can be controlled. Thus, if electromagnetic absorbing pattern 104/154 of FIG. 1/FIG. 2 is embedded in coating 110/160 that is composed of an appropriately doped dielectric, also sometimes referred to as a "leaky dielectric", the above electrostatic arcing is prevented because of at least two reasons: (1) As a result of the bulk conductivity and charge redistribution because of the instant leaky dielectric, the electrostatic charge differential between various isolated parts/islands of the pattern ceases to exist, and (2) the breakdown voltage of the dielectric medium of coating 110/160 is much higher than air.

In preferred embodiments, coatings 110 and 160 of FIG. 1 and FIG. 2 respectively may be composed of an appropriately doped $SiO_2$, $Al_2O_3$, etc. Thus, in addition to providing protection from mechanical damage, instant protective conformal coating 110/160 of FIG. 1/FIG. 2 protects underlying pattern 104/154 respectively from electrostatic (or simply put static) arcing. Differently stated, instant protective conformal coating 110/160 provides mechanical as well as electrostatic protection to underlying pattern 104/154 respectively.

2. Uniformity of thickness: As an advantage of the present design, instant conformal coating 110/160 has an extremely uniform thickness across a large surface area of the mask because it is formed one atomic layer at a time. The mask can be 6 inches across while still resulting in coating 110/160 to be extremely uniform even after having deposited hundreds of layers, because of growing/depositing of the coating via ALD only one atomic layer at a time.

This is clear if we take advantage of FIG. 2. As noted above, FIG. 2 shows a portion or subsection of an instant protected lithography mask 150 with substrate 152 on which a feature 154 of an electromagnetic radiation absorbing pattern is shown. Per above, we may just use the reference numeral 154 to refer to the entire electromagnetic radiation absorbing pattern of mask 150 for reasons of brevity, with the knowledge that there may be many features of the pattern present on mask 150.

Further shown in FIG. 2 are just three distinct atomic layers 160A, 160B and 160C of an instant conformal protective coating deposited via ALD techniques. As shown in FIG. 2, resultant coating 160 is extremely uniform because it is formed or grown in an ALD chamber in a self-limiting manner, one atomic layer a time.

3. Uniform stoichiometric composition: The chemical composition of coating 110/160 of FIG. 1/FIG. 2 is also extremely uniform. This results in a refractive index of the coating that is uniform across the entire surface area of the mask.

4. Index matching to substrate: The refractive index of protective conformal coating 110/160 of FIG. 1/FIG. 2 respectively can be precisely matched to the refractive index of the underlying substrate. If mask 120 or 150 of FIG. 1 or FIG. 2 respectively is an EUV mask, the underlying substrate comprises a reflective multilayer (ML) of the EUV mask per below discussion. In this case, the index matching may be done with the first or topmost layer of the ML.

Regardless, as a result of this index matching, there is no unwanted reflection of incident electromagnetic radiation at the interface of conformal coating 110/160 and the underlying substrate (or ML). This reduces or eliminates any unwanted interference patterns at or near the interface, thereby eliminating undesired optical artifacts. For photomasks, this consequently means more high-quality printing and greater yield. The indices per above may be substantially matched, exemplarily up to $1/100$th decimal places or even lower.

5. No optical defects due to crystalline particles: Yet another advantage of the present technology is that since the ALD process is nucleation-based instead of flow-based CVD processes of the prior art, there is no formation and settling of spurious crystalline particles on the mask. In the techniques of the prior art, such crystalline particles cause optical defects in the coating that result in defective features of the mask and eventually lower yield. However, there is no such build-up of crystalline particles in the present design and hence an improvement in feature production/quality and consequently greater yield.

6. High-quality step-coverage: Step-coverage refers to the property of the conformal protective coating to deposit evenly or uniformly on the top/tops or distal end/ends, as well as on the sides/sidewalls of the features of the pattern. Since an ALD grown coating is formed one atomic layer at a time, and since the process is self-limitation and nucleation-based, as a consequence, the deposited coating is even all around the pattern features.

This aspect of the present technology is clear from FIG. 1 explicitly showing step coverage 112 on the sidewalls or sides of pattern 104 to be of the same thickness as on the top or distal end. This is also clear from FIG. 2, where there are exactly three atomic layers 160A, 160B and 160C of instant conformal coating 160 on the sides as well as the top of pattern feature 154. This excellent step coverage results in high-resolution printing of the pattern in photolithography due to desirable phase-shift effects from smooth and uniform coating on the sidewalls of the pattern. Ultimately this results in higher quality product and greater yield. The techniques of the prior art oftentimes leave voids in any protecting layer which scatter light and affect image fidelity.

7. Stress and/or distortion free at a wide range of temperatures: Yet another key advantage of the present technology is that the conformal protective coating, such as coating 110 of FIG. 1 and coating 160 of FIG. 2 can by deposited via ALD at a wide variety or range of temperatures. This is in contrast to the typical CVD process of the prior art where extreme temperatures and vacuum conditions must be achieved to deposit a decent quality flow-based film. More specifically, the instant protective coating may be grown via ALD at room temperature i.e. between 20-60° C. or even 20-25° C.

8. Gradient coating: Still another benefit of the present technology over the prior art is that instant conformal coating can be grown to comprise of different materials or chemical species. This is because an ALD grown coating is deposited/grown one atomic layer at a time. With the desired combination of various precursors and chemical agents introduced into the ALD chamber, atomic layers of different compositions can be deposited as part of the instant conformal coating.

Therefore, while referring to the exemplary embodiment of the drawing of FIG. 2, atomic layer 160A-B may be of $SiO_2$. Now, if instant protected mask 150 is to be processed in a particularly harsh application, or if a precise/rigorous index-matching of conformal coating 160 to underlying substrate 152 is required, then atomic layer 160C may be of a different material.

Of course, in practical applications, the number of such overlying and underlying layers of $SiO_2$ and/or other materials may be more i.e. in dozens or hundreds or more. In a similar manner, any number and types of such layers may be deposited in a tapered manner one on top of another as an instant gradient conformal protective coating based on the instant principles.

9. Reduced light-scattering due to ultra-smooth surface of coating: Because the surface of the conformal protecting coating, such as coating 110 of FIG. 1 and 160 of FIG. 2, is extremely smooth, there is minimal light scattering from the surface of the coating. This results in reduced optical defects and higher image fidelity. This in turn results in better control of line widths of the printed image and consequently the speed of the device. This is especially important as smaller design rules are sought. Further, it improves printability of contact holes and thus minimizing of yield loss.

10. Plasma enhanced ALD (PEALD) or plasma-activated ALD (PALD): In a set of highly preferred embodiments, the ALD process employed is plasma enhanced ALD (PEALD) or plasma-activated ALD (PALD) accruing the consequent benefits of such a plasma-based design over standard ALD.

11. Continuous-flow PEALD/PAALD: In still another set of highly preferred embodiments, the PEALD/PAALD is a continuous-flow process as taught in U.S. Pat. Nos. 9,972,501 B1, 10,366,898 B2 and 10,361,088 B2, all to Birol Kuyel, and which are all incorporated herein by reference in their entireties. Therefore, these preferred embodiments accrue the consequent benefits taught in these references of continuous-flow PEALD/PAALD over standard PEALD/PAALD techniques.

Figure 3:
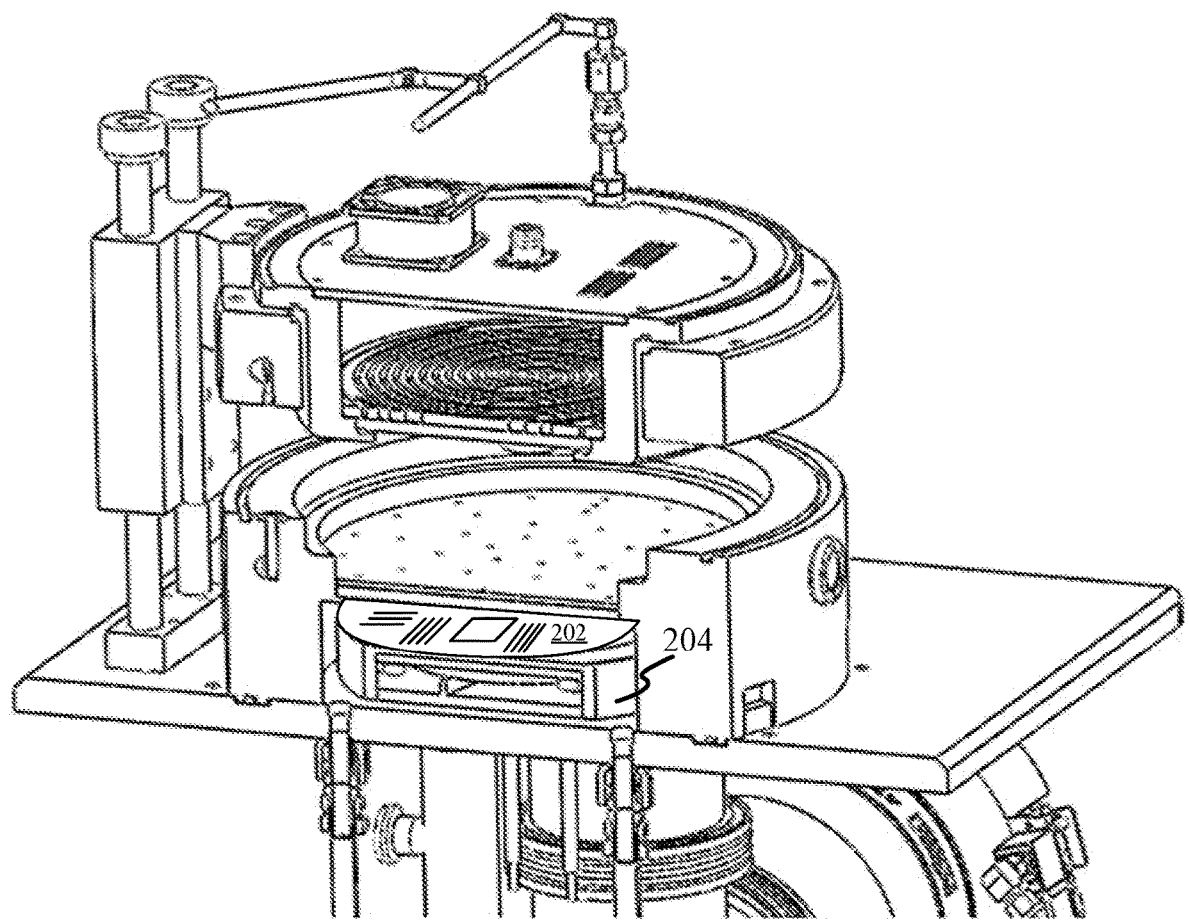
FIG. 3 illustrates a cross-sectional view of a continuous-flow plasma-enhanced atomic layer deposition (PEALD) chamber assembly of a preferred embodiment that is used to deposit an instant conformal coating.

FIG. 3 shows a cross-sectional view of such a continuous-flow PEALD chamber assembly 200 in which a lithography mask 202 is being coated with nucleation-based atomic layers to form an instant conformal coating 110 or 160 as shown in FIG. 1 and FIG. 2 respectively. More specifically, FIG. 3 shows mask 202 on platen heater 204 of chamber assembly 200. For further details, the reader is referred to the above-mentioned references.

As taught in the above-mentioned references, since one of the attribute of the above continuous-flow process is that it cuts the cycle-time or process time dramatically i.e. approximately by half as compared to other techniques. Therefore, for the present embodiments, this attribute has the advantage that it correspondingly reduces the probability of particles falling on the substrate also approximately by half, because the process/cycle-time is cut in half as well. This has the advantage of making instant coatings very defect-free.

12. Pelliclized lithography masks or reticles: Pellicles are typically used as dust covers to prevent particles falling onto the lithographic or electromagnetic radiation absorbing patterns of projection photomasks or EUV masks or reticles thereof. Since the particles are captured on top of the pellicle rather than on the pattern where the focal plane is, they do not print because of insufficient contrast. However, occasionally the pellicle gets damaged and needs to be removed and replaced. This process requires removal of the reticle frame glue and the cleaning of the mask.

Since the lithographic mask/reticle cannot typically be cleaned by brushing, it requires sending it back to the mask shop for cleaning and re-pelliclization. It is during this cleaning process that the mask/reticle is most vulnerable to damage. Also, current leading-edge devices have "matched" reticles belonging to a set of reticles for exposing the entire wafer. If one reticle is destroyed then the entire set of reticles needs to be replaced. This is extremely costly and cannot be done readily, thus causing costly interruption of production.

The present technology overcomes such a shortcoming of the prior art. More specifically, if the projection photomask or EUV mask or their reticle has an instant protective coating, such as coating 110 or 160 of FIG. 1 and FIG. 2 respectively, it can be quickly cleaned on-site and the mask/reticle can then be re-pelliclized. This is because the coating provides a robust protective layer for the projection mask/reticle.

Figure 4:
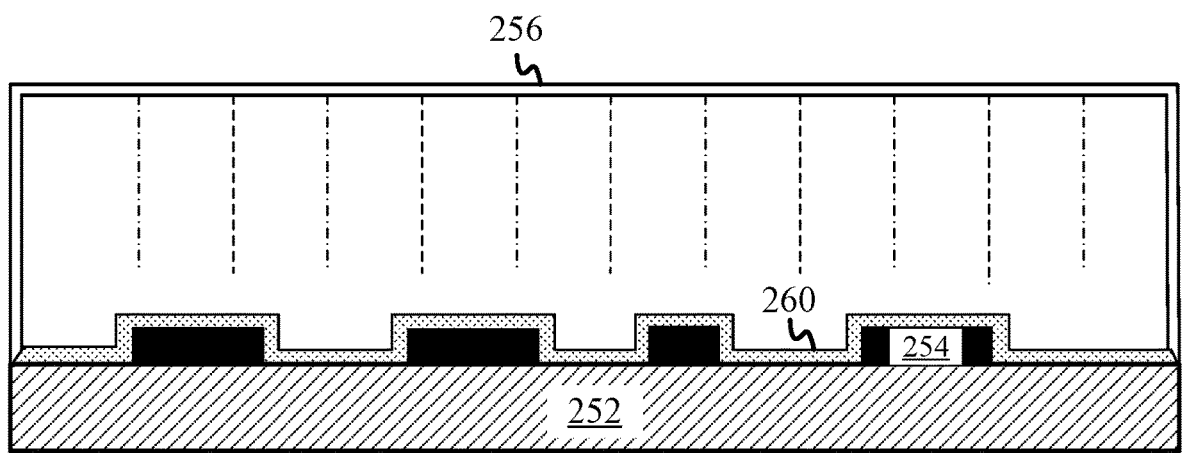
FIG. 4 shows a cross-sectional view of an embodiment where a pellicle is used to cover/house a protected lithographic mask or reticle containing an instant conformal coating protecting the mask with its lithographic pattern on an underlying substrate.

FIG. 4 shows in a cross-sectional view, a pellicle 256 covering/protecting an instant protected reticle 250 with an instant conformal coating 260 of the present teachings.

Coating 260 is protecting a lithographic pattern 254 on an underlying substrate 252. Reticle 250 may be a part of a projection photomask or in other words it may be a projection reticle. Alternatively, reticle 250 may be an EUV reticle, in which case substrate 252 may be a multilayer (ML) substrate along with the various coatings/layers for EUV lithography known in the art. EUV masks/reticles are further discussed below in these teachings.

The advantages of the present technologies are also accrued by such pelliclized lithographic masks/reticles as shown in FIG. 4. Per above, once the pellicle is removed for cleaning, instant reticle 250 with its instant conformal coating 260 mechanically protecting the underlying pattern and reticle, may be cleaned on-site and re-pelliclized without having to send it back to the mask shop. This results in significant savings in operational costs, and improvements in yield and efficiencies.

13. Amenable to aggressive cleaning: Yet another benefit of the present conformal protective coating of the instant technology is that it can withstand very aggressive cleaning methods without incurring damage to itself or to the mask/reticle underneath. Such aggressive cleaning techniques include:

a. Aggressive chemical cleaning even with the most aggressive Piranha solution.

b. Abrasive brush cleaning. In addition to chemical cleaning, the present protective coating also allows for brushing of the protected mask/reticle, which may be an abrasive process and not possible without damaging the pattern in the absence of the instant coating. This is especially important during laser mask repair process in which a damaged lithographic mask is repaired with a laser beam. The laser beam is used to ablate unwanted metallic pattern particles from the substrate. However, during this process, the ablated metallic particles rain as debris on the mask and get settled thereon.

These rained/settled particles are subsequently hard to clean. However, if the mask is protected by an instant conformal protective coating, these ablated and rained/settled particles can be aggressively removed, for example, by brush cleaning or aggressive chemical cleaning. Exemplary aggressive chemical cleaning in such a scenario include cleaning with buffered hydrofluoric acid (HF1).

14. Application to EUV lithography: Yet another advantage of the present technology is that it is very suitable for protecting next-generation EUV lithography masks. Such an embodiment protecting an EUV mask or its reticle by an instant conformal coating of the above teachings is shown in the cross-sectional views of FIG. 5A-B.

Figure 5A:
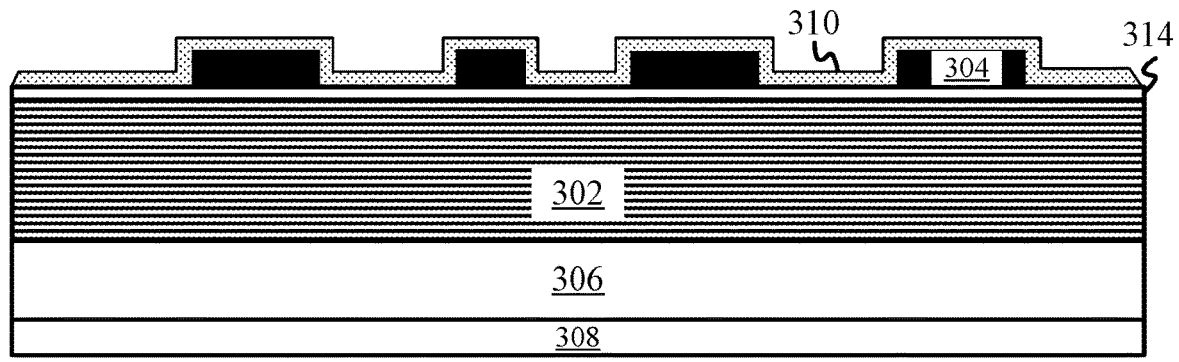
FIG. 5A shows an embodiment where an instant conformal coating is used to protect an extreme ultraviolet (EUV) lithographic mask or a reticle with its lithographic pattern on an underlying substrate and the associated layers.

More specifically, FIG. 5A shows protected EUV mask 300 that comprises of the typical layers or parts of a traditional EUV mask, namely a backside coating 308, a low thermal-expansion (LTE) substrate 306, a reflective silicon-molybdenum (Si/Mo) multilayer (ML) 302, a capping layer 314 and a pattern mask 304 composed of a suitable absorber material such as tantalum (Ta) or tungsten (W). However, unlike a traditional EUV mask, protected EUV lithography mask 300 of FIG. 5A has the additional layer 310 which is an instant conformal protective coating deposited by ALD on top of pattern 304 and underlying mask per prior teachings.

Typically, an EUV mask is slightly curved for facilitating convergence of incident EUV rays. Thus, it acts as a reflective mask while typically demagnifying/reducing the printed image by 4:1. Sometimes substrate 306, ML 302 and capping layer 314 are collectively referred to as the substrate. Absorbing/absorber pattern 304 is especially suited for absorbing extreme ultraviolet (EUV) electromagnetic radiation with wavelength of 13.5 nm, also sometimes referred to as "soft" x-rays.

EUV or soft x-ray electromagnetic radiation incident on lithography mask 300 is absorbed by pattern 304 where it is present, and reflected my ML reflective layer 302 where there is no absorbing pattern 304. Ultimately, pattern 304 and more specifically its "negative" is printed to a wafer, or portion thereof if mask 300 is actually an EUV reticle. The mask/reticle with its photoresist is then developed. EUV lithography holds great promise because of its ability to print extremely small feature sizes.

However, an EUV mask must undergo strenuous inspections throughout manufacturing and printing process, in order to ensure that it is defect-free and also free from undesired particles or impurities. Especially ML layer 302 with its many alternating constituent layers is prone to entrapping particles, resulting in fabrication defects and lower yields. The present technology improves EUV lithography by protecting an EUV mask including its lithographic pattern 304 by a protective conformal coating 310 shown in FIG. 5A. In addition to the benefits of instant protective conformal coating techniques discussed above, let us discuss their benefits as they apply to EUV lithography. As such, the advantages of an instant coating 310 for a protected EUV lithography mask 300 are:

a. Mechanical protection: In addition to providing electrostatic protection per above, conformal coating or film 310 mechanically protects the underlying mask. As a result, any deposited particles are easily cleanable by aggressive and reliable cleaning techniques per above.

b. No attenuation: Coating 310 can be made extremely thin via ALD, thereby causing no attenuation of the incident EUV rays. Exemplarily, coating 310 can be just 10 Å high/thick which is just a fraction of 13.5 nm wavelength of the incident ultraviolet electromagnetic radiation or soft x-rays. This results in negligible attenuation of the incident radiation. Such a 10 A layer can be deposited using ALD one atomic layer at a time. For example, one atomic SiO2 layer is approximately 2 Å thick. So, in our example above, the 10 A monolayer would just require 5 atomic layers of SiO2.

c. Index matching: Per above, because instant conformal coating 310 can be grown to be very thin as compared to the wavelength of the incident EUV rays, coating 310 does not affect the EUV rays in any way that would adversely affect the eventual printing of mask 304 on the wafer. Therefore, it may not be necessary to match the index of coating 310 to underlying capping layer or ML.

However, oftentimes since EUV mask 300 may undergo optical inspections under optical wavelengths, in such scenarios the index of instant coating 310 can be matched to the first or topmost layer of ML 302, or capping layer 314. This advantageously results in no reflection at the interface of coating 310 and ML 302 or capping layer 314, and hence no consequent optical artifacts due to interference patterns at the interface. As a result, optical inspections of mask 300 can be readily performed with ease.

d. Thin coating and better EUV inspections: Some EUV defects do not show under optical wavelengths. Therefore, inspections of EUV masks under EUV rays is also required. Because instant conformal coating is very thin, it does not absorb enough EUV rays to affect or prevent such EUV inspections.

e. Sacrificial coating: Coating 310 may also be made sacrificial. In other words, once protected EUV mask 300 has been manufactured, or once the requisite inspections have taken place, coating 310 may be removed, for example, by plasma etching in a suitable reactor.

Based on above, a preferred EUV mask architecture based on the present technology employs depositing a thin instant protective coating on an EUV mask blank. The blank is then inspected for any trapped particles or imperfections under optical light. Afterwards, the initial protective coating may be removed, for example by etching. Alternatively, the initial instant protective coating is left on the EUV blank.

Figure 5B:
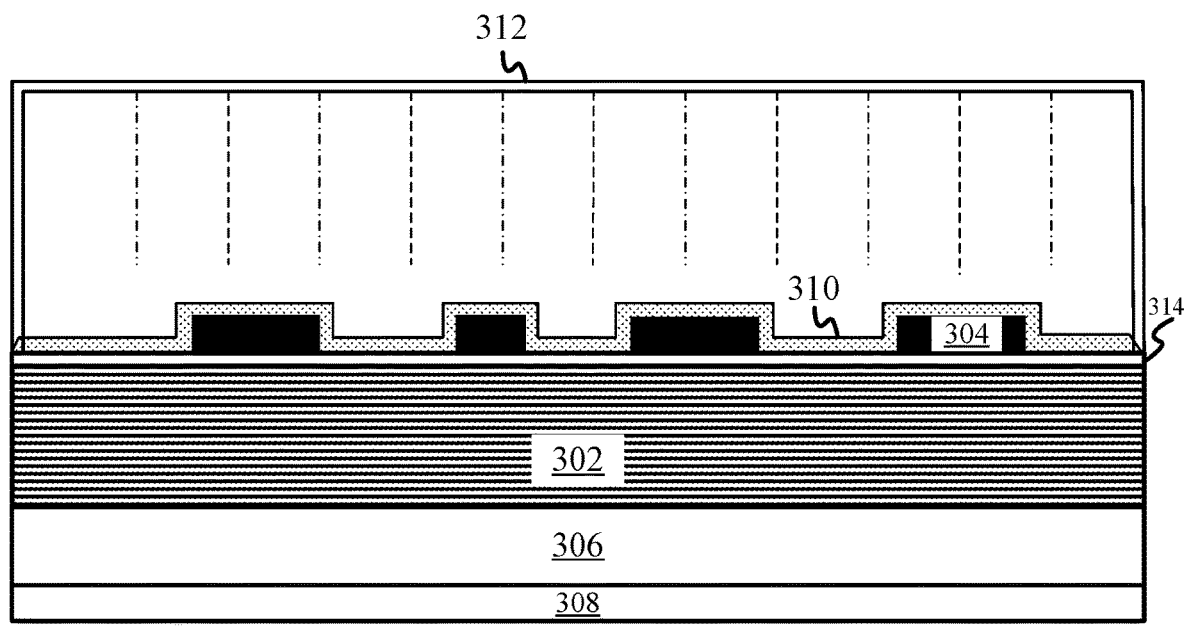
FIG. 5B shows the embodiment of FIG. 5A where a pellicle is used to house/cover the EUV mask/reticle.
Figure 5B:

Regardless, lithographic patterning is then performed by depositing the absorber material. Finally, another thin instant conformal protective coating is deposited with its benefits described herein. Because the instant coating is very thin and uniform, it does not prevent/affect any EUV inspections that are then performed during production. This is so, even if the initial protective coating is left on the mask blank per above. For EUV lithography, instant conformal protective coating may be made from materials other than SiO2, such as Al2O3, etc.

f. Pelliclization: As in the case of a photomask, an EUV mask or a reticle may also be pelliclized. Such a pelliclized EUV embodiment is shown in FIG. 5B where protected EUV mask/reticle 300 of the present design is protected under a pellicle 312. The above advantages of the present technology are also accrued when the EUV mask/reticle is thus protected under a pellicle. Pellicle 312 complements coating 310 by protecting the focal plane of mask 300 by stopping particles on the pellicle, rather than letting them deposit on mask 300 or its protective conformal coating 310. Furthermore, EUV pellicles, such as pellicle 312 of FIG. 5B, may be made out of thin inorganic films which can sometimes break. In such a scenario, because lithographic pattern 304 is protected by instant protective conformal coating 310, it allows removal of the particles and debris that had landed on it due to the pellicle breakage, without harming underlying pattern 304.

Figure 6:
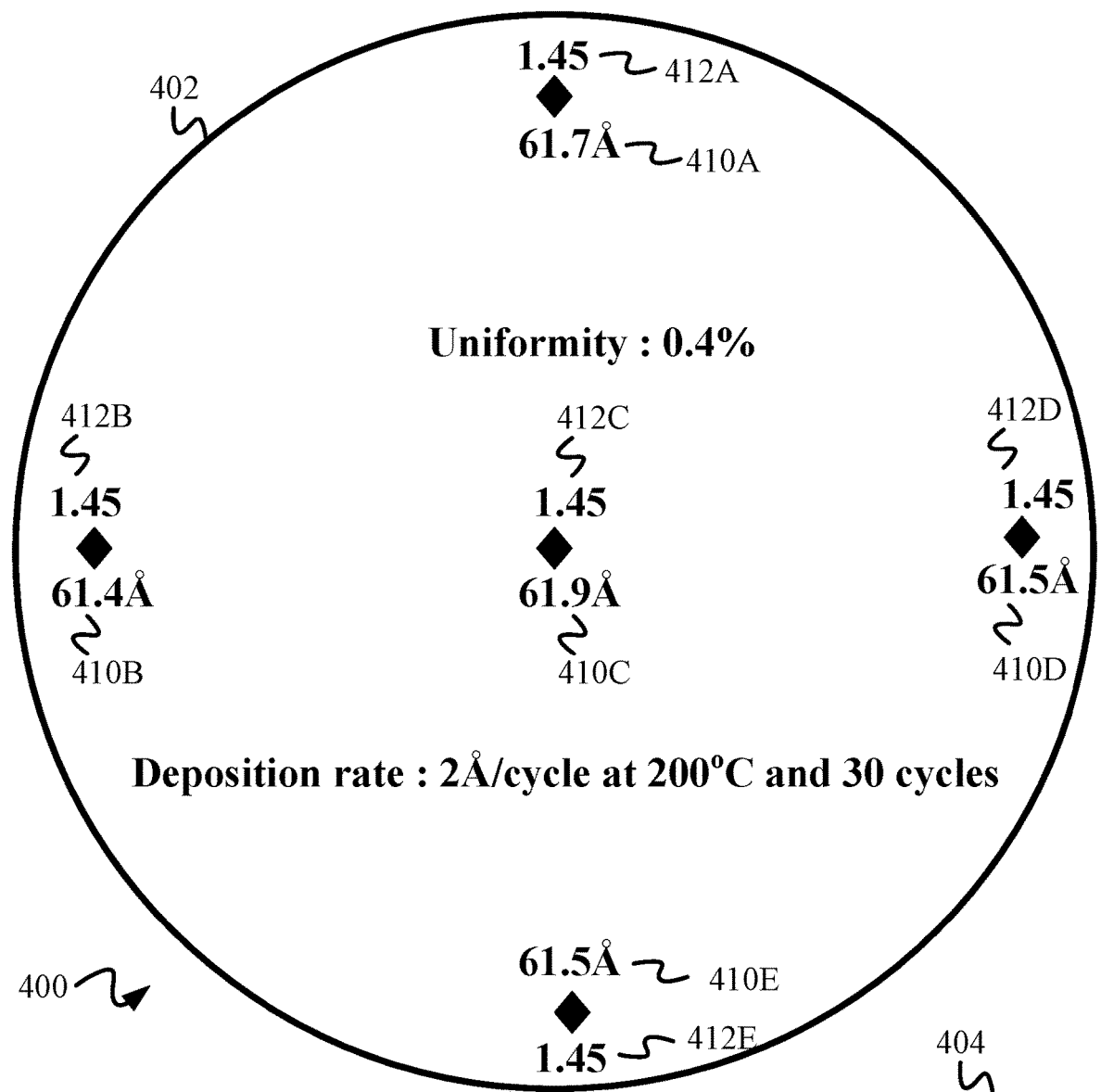
FIG. 6 shows a dataset from an exemplary embodiment depositing an instant conformal coating of SiO2 at 200° C. on a lithography mask, using continuous-flow PEALD.

To further elucidate the benefits of the instant design over traditional art, FIG. 6 shows a dataset 400 from an exemplary implementation of the present technology, depositing SiO2 at 200° C. on a lithography mask using continuous-flow PEALD chamber assembly 200 shown earlier in FIG. 3. In this experiment SiO2 is deposited on a lithography mask or reticle indicated by circle 402 via continuous-flow PEALD/PAALD using parameters shown by box 404. The observed thickness and refractive index of the resultant instant conformal protective coating at various locations indicated by black diamonds of a 6-inch diameter mask/reticle are indicated as shown.

More specifically, thickness values 410A, 410B, 410C, 410D and 410E at top, left, center, right and bottom locations respectively of the mask/reticle as measured in the experiment are indicated. Similarly, refractive index values 412A, 412B, 412C, 412D and 412E at top, left, center, right and bottom locations respectively of the mask/reticle as measured in the experiment are indicated.

From FIG. 6, it can be clearly seen that the present technology produces an extremely uniform thickness at 200° C. with a uniformity variation (or simply uniformity) of only 0.4% across the 6-inch diameter as shown. This value is calculated by subtracting the lowest thickness on the mask/reticle from the highest thickness and dividing the resultant value by a mean of all thickness values.

Such a uniform thickness of instant conformal coating as shown in FIG. 6 affords many benefits as taught above. In an analogous fashion, the present technology produces the coating to have an extremely uniform stoichiometric or chemical composition over techniques of the prior art. This is proved by refractive index values 412A-E that are identical across the various locations indicated by black diamonds on mask/reticle 402.

Figure 7:
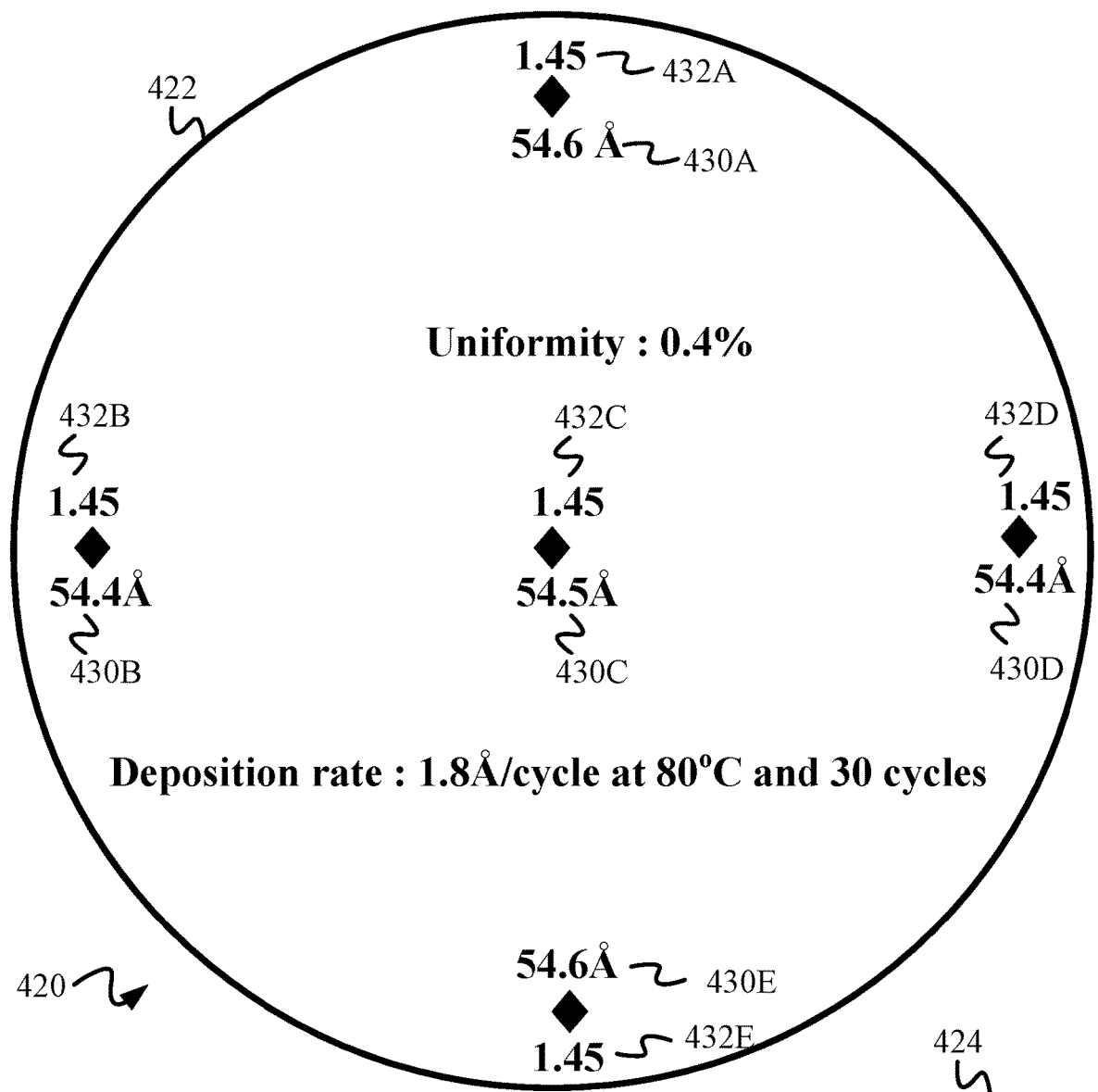
FIG. 7 is a variation of the embodiment of FIG. 6 performing the deposition at 80° C.

In a similar manner, FIG. 7 shows a dataset 420 from an exemplary implementation of the present technology, depositing SiO2 at 80° C. on a lithography mask or reticle using continuous-flow PEALD per above teachings. In this experiment SiO2 is deposited on a mask/reticle indicated by circle 422 via continuous-flow PEALD/PAALD using parameters shown by box 424. The observed thickness and refractive index of the resultant instant conformal protective coating at various locations indicated by black diamonds of a 6-inch diameter mask/reticle are indicated as shown.

More specifically, thickness values 430A-E at top, left, center, right and bottom locations respectively of the mask as measured in the experiment are indicated. Similarly, refractive index values 432A-E at top, left, center, right and bottom locations respectively of the mask/reticle as measured in the experiment are indicated.

From FIG. 7, it can be clearly seen that the present technology produces an extremely uniform thickness even at only 80° C. with a uniformity variation of only 0.4% across the 6-inch diameter as shown. Such a uniform thickness coating affords many benefits as taught above. In an analogous fashion, the present technology produces the coating to have an extremely uniform stoichiometric or chemical composition over techniques of the prior art. This is proved by refractive index values of 432A-E that are identical across the various locations indicated by black diamonds on mask/reticle 422.

Figure 8:
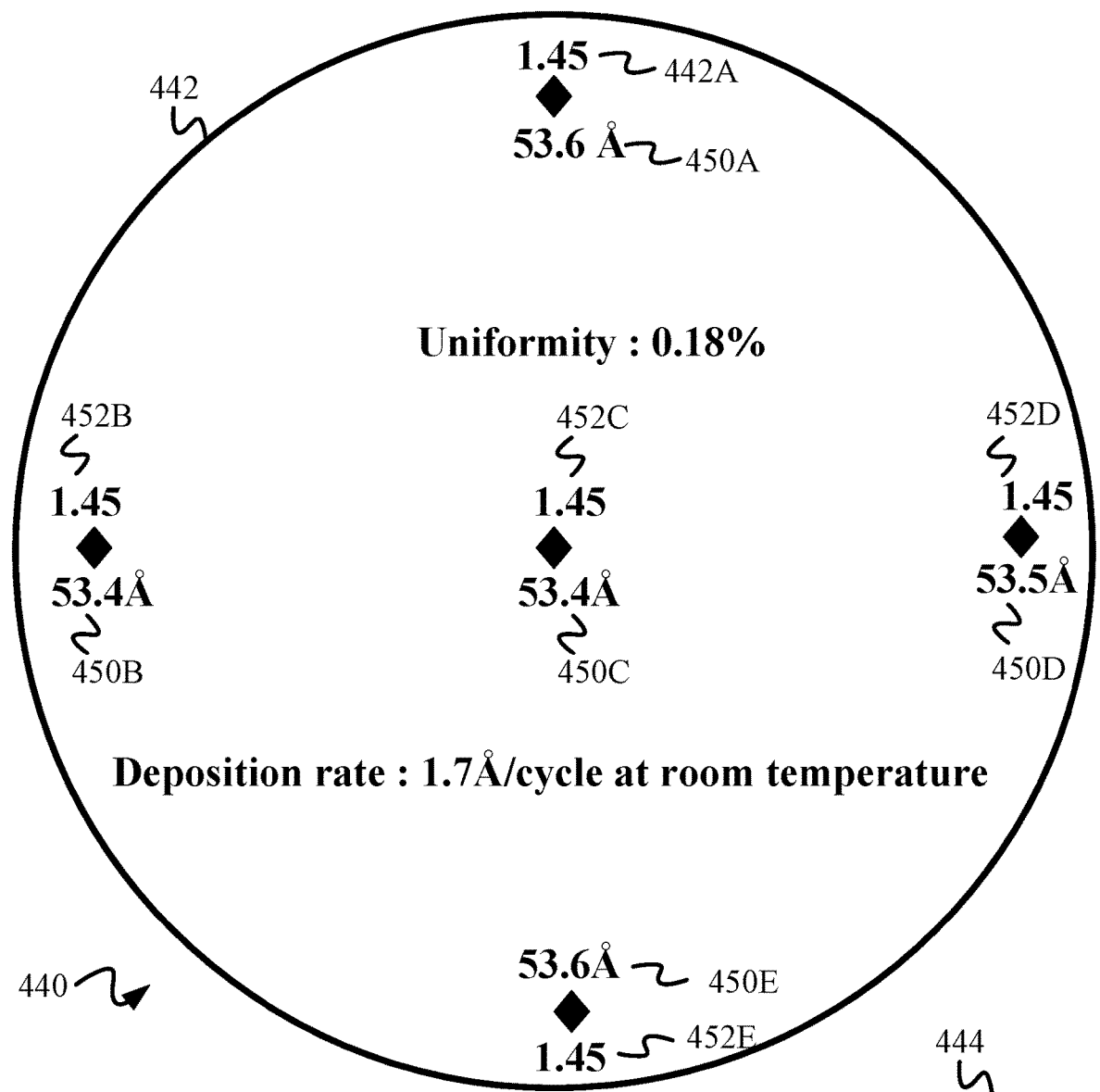
FIG. 8 is a variation of the embodiment of FIG. 6 performing the deposition at room temperature.

FIG. 8 shows yet another dataset 440 from an exemplary implementation of the present technology, depositing SiO2 at room temperature (in the range of 20-25° C.) on a photomask using continuous-flow PEALD per above teachings. In this experiment SiO2 is deposited on a lithography mask or reticle indicated by circle 442 via continuous-flow PEALD/PAALD using parameters shown by box 444. The observed thickness and refractive index of the resultant instant conformal coating at various locations indicated by black diamonds of a 6-inch diameter lithography mask/reticle are indicated as shown.

More specifically, thickness values 450A-E at top, left, center, right and bottom locations respectively of the mask/reticle as measured in the experiment are indicated. Similarly, refractive index values 442A-E at top, left, center, right and bottom locations respectively of the mask/reticle as measured in the experiment are indicated.

From FIG. 8, it can be clearly seen that the present technology produces an extremely uniform thickness even at room temperature with a uniformity variation of only 0.18% across the 6-inch diameter as shown. Such a uniform thickness coating affords many benefits as taught above. In an analogous fashion, the present technology produces the coating to have an extremely uniform stoichiometric or chemical composition over techniques of the prior art. This is proved by refractive index values 442A-E that are identical across the various locations indicated by black diamonds on mask/reticle 442.

In view of the above teaching, a person skilled in the art will recognize that the apparatus and methods of invention can be embodied in many different ways in addition to those described without departing from the principles of the invention. Therefore, the scope of the invention should be judged in view of the appended claims and their legal equivalents.

What is claimed is:

1. A method comprising the steps of:
   (a) depositing by continuous-flow plasma enhanced atomic layer deposition (PEALD), a conformal coating on all sides and a distal end of a pattern existing on an substrate of a lithography mask, said pattern meant for absorbing electromagnetic radiation incident on said lithography mask;
   (b) retaining said conformal coating on said all sides and said distal end for protecting said pattern;
   (c) suppressing an electrostatic charge differential in said pattern by causing said conformal coating to act as a leaky dielectric, said causing done by a controlled doping of hydrogen in said conformal coating;
   (d) said PEALD performed by placing said substrate atop a platen inside a chamber, said chamber further having a planar inductively coupled plasma (ICP) source laterally affixed at its distal end from said substrate;
   (e) isolating said substrate from said ICP source in said chamber by a metal plate laterally affixed above said substrate and a ceramic plate laterally affixed below said metal plate but above said substrate, said metal plate and said ceramic plate having a first plurality of holes and a second plurality of holes respectively such that each of said first plurality of holes is aligned with a corresponding hole of said second plurality of holes, where each of said second plurality of holes is designed to have a diameter less than two Debye lengths of a plasma generated by said ICP source above said metal plate;
   (f) continuously flowing a gas A at a steady-state pressure to said ICP source to continuously generate said plasma;
   (g) grounding said metal plate to terminate said plasma;
   (h) passing into said chamber a pulse of a gas B below said ceramic plate, whereby excited neutrals from said gas A, said gas B and said substrate react in a self-limiting manner to produce said conformal coating on said substrate; and
   (i) providing said conformal coating to be $SiO_2$;
   wherein said PEALD occurs at a temperature in the range of 20-80° C. and at a rate of 1.7-1.8 Angstroms per cycle, and said PEALD has a cycle-time equal to the sum of the duration of said pulse in step (h) and a time period until said pulse in step (h) has decayed to said steady-state pressure, and wherein said conformal coating does not contain spurious crystalline particles.

2. The method of claim 1 providing said conformal coating to be composed of more than one chemical species.

3. The method of claim 1 providing said lithography mask to be one of a binary photomask, a phase-shift photomask (PSM) and an extreme ultraviolet (EUV) mask.

4. The method of claim 1 providing said lithography mask to be one of a contact photomask, a proximity photomask and a projection photomask.

5. The method of claim 1 performing said protecting of said pattern on a reticle of said lithography mask when said lithography mask is an extreme ultraviolet (EUV) mask.

6. The method of claim 5, wherein said conformal coating is thin enough so as to cause no attenuation of incident EUV rays.

7. The method of claim 5, wherein said conformal coating is a sacrificial coating that is removed by plasma etching once said EUV mask has been manufactured.

8. The method of claim 1 providing the refractive indices of said conformal coating and an underlying substrate to be substantially similar.

* * * * *